United States Patent
Luo et al.

(10) Patent No.: US 11,205,756 B2
(45) Date of Patent: Dec. 21, 2021

(54) GREEN LIGHT THERMALLY ACTIVATED DELAYED FLUORESCENCE (TADF) MATERIAL AND APPLICATION THEREOF

(71) Applicant: Wuhan China Star Optoelectronics Semiconductor Display Technology Co., Ltd., Wuhan (CN)

(72) Inventors: Jiajia Luo, Wuhan (CN); Xianjie Li, Wuhan (CN); Yu Gu, Wuhan (CN); Jinchang Huang, Wuhan (CN); Lin Yang, Wuhan (CN); Yamei Bai, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 456 days.

(21) Appl. No.: 16/326,715

(22) PCT Filed: Jan. 17, 2019

(86) PCT No.: PCT/CN2019/072132
§ 371 (c)(1),
(2) Date: Feb. 20, 2019

(87) PCT Pub. No.: WO2020/113789
PCT Pub. Date: Jun. 11, 2020

(65) Prior Publication Data
US 2020/0185614 A1 Jun. 11, 2020

(30) Foreign Application Priority Data
Dec. 5, 2018 (CN) .......................... 201811480765.4

(51) Int. Cl.
*H01L 51/50* (2006.01)
*H01L 51/00* (2006.01)

(52) U.S. Cl.
CPC ...... *H01L 51/0067* (2013.01); *H01L 51/0025* (2013.01); *H01L 51/5056* (2013.01); *H01L 51/5072* (2013.01)

(58) Field of Classification Search
None
See application file for complete search history.

(56) References Cited

U.S. PATENT DOCUMENTS

2016/0087218 A1* 3/2016 Kim .................... H01L 51/0058
257/40
2018/0291264 A1 10/2018 Lee et al.

FOREIGN PATENT DOCUMENTS

CN 105503766 4/2016
CN 108048076 5/2018
(Continued)

OTHER PUBLICATIONS

Takahashi et al., Donor-acceptor-structured 1,4-diazatriphenylene derivatives exhibiting thermally activated delayed fluorescence: design and synthesis, photophysical, Science and Technology of Advanced Materials, May 27, 2014, vol. 15, No. 3, pp. 1-10 (Year: 2014).*

(Continued)

*Primary Examiner* — Gregory D Clark

(57) ABSTRACT

The present invention provides a green light thermal activation delayed fluorescent material, a synthesizing method thereof, and an electroluminescent device. The green light thermal activation delayed fluorescent material is a target compound having a molecular structure of D-A and synthesized by a reaction of an electron donor and an electron acceptor, wherein the electron acceptor being a planar electron acceptor in an ultra-low triplet energy state, and a triplet energy state of the target compound ranging from 2.0 to 3.0 eV. The method for synthesizing a green light thermal activation delayed fluorescent material includes the follow- (Continued)

ing steps: a reaction solution preparation step; a target compound synthesis step; an extraction step; and a target compound purification step. The electroluminescent device includes: a substrate layer; a hole transporting and injecting layer; a light emitting layer; an electron transporting layer; and a cathode layer.

8 Claims, 2 Drawing Sheets

(56) References Cited

FOREIGN PATENT DOCUMENTS

| | | |
|---|---|---|
| CN | 108383854 | 8/2018 |
| JP | 2018-035135 | 3/2018 |

OTHER PUBLICATIONS

Takahashi et al., Donor-acceptor-structured 1,4-diazatriphenylene derivatives exhibiting thermally activated delayed fluorescence: design and synthesis, photophysical properties and OLED characteristics; Science and Technology of Advanced Materials, May 27, 2014, vol. 15, No. 3, pp. 1-10 (Year: 2014).*

* cited by examiner

GREEN LIGHT THERMALLY ACTIVATED DELAYED FLUORESCENCE (TADF) MATERIAL AND APPLICATION THEREOF

RELATED APPLICATIONS

This application is a National Phase of PCT Patent Application No. PCT/CN2019/072132 having International filing date of Jan. 17, 2019, which claims the benefit of priority of Chinese Patent Application No. 201811480765.4 filed on Dec. 5, 2018. The contents of the above applications are all incorporated by reference as if fully set forth herein in their entirety.

FIELD AND BACKGROUND OF THE INVENTION

The invention relates to the field of display, in particular to a green light thermally activated delayed fluorescent material, a synthesis method thereof, and an electroluminescent device.

It is known that organic light-emitting diodes (OLEDs) have attracted attention from many researchers, due to their huge application prospects and advantages, such as self-illumination without the need for a backlight, high luminous efficiency, wide viewing angles, fast response speed, a large temperature adaptation range, relatively simple production and processing techniques, low driving voltage, low energy consumption, lightness, thinness, flexibility, and so on. In OLEDs, a dominant luminescent guest material is critical. Guest luminescent materials for early OLEDs are fluorescent materials. Because the ratio of excitons in a singlet energy state and excitons in a triplet energy state in the OLED is 1:3, the theoretical internal quantum efficiency (IQE) of fluorescent-based OLEDs can merely reach 25%, thus considerably limiting the application of fluorescent electroluminescent devices. Heavy metal complex phosphorescent materials can achieve 100% IQE by using the excitons in the singlet energy state and the excitons in the triplet energy state due to a spin-orbit coupling of heavy atoms. However, heavy metals commonly employed are precious metals, such as Ir, Pt, and the like, and the heavy metal complex phosphorescent materials have yet to be developed in fields of blue light materials. Through a molecular design, pure organic thermally activated delayed fluorescence (TADF) materials can have a small minimum energy state difference ($\Delta E_{ST}$) between the singlet energy state and the triplet energy state, so that the excitons in the triplet energy state can be returned by reverse intersystem crossing (RISC) back to the singlet energy state, then to a ground state by a radiation transition to emit light, and thereby simultaneously use the excitons in the singlet energy state and in the triplet energy state, and 100% IQE may also be achieved.

For TADF materials, the fast reverse intersystem crossing constant (kRISC) and a high photoluminescence quantum yield (PLQY) are necessary for preparation of high efficiency OLEDs. At present, TADF materials with the above conditions are still relatively scarce compared to the heavy metal, Ir complexes. In electroluminescent devices, the brightness of green light accounts for the largest proportion of light, and the development of a highly efficient green light-emitting material is particularly important.

SUMMARY OF THE INVENTION

An object of the present invention is to provide a green light thermally activated delayed fluorescent material and a synthesis method thereof, and an electroluminescent device for solving the technical problem of low photoluminescence quantum yield and low proportion of thermally activated delayed fluorescent materials in the entire thermally activated delayed fluorescent material system in the prior art.

In order to achieve the above object, the present invention provides a green light thermally activated delayed fluorescent material, which is a target compound having a molecular structure of D-A and synthesized by a reaction of an electron donor and an electron acceptor, wherein D is the electron donor and A is the electron acceptor, the electron acceptor having a fluorine atom or a fluorine-containing group, the electron acceptor being a planar electron acceptor in an ultra-low triplet energy state, and a triplet energy state of the target compound ranging from 2.0 to 3.0 eV.

Further, the electron acceptor has a molecular structure of:

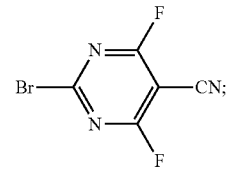 [SMILES: N#Cc1c(F)nc(Br)nc1F]

and the electron donor includes at least one of 9,10-dihydro-9,9-dimethylacridine, phenoxazine, and phenothiazine Further, the molecular structure D-A of the green light thermal activated delayed fluorescent material is one of the following molecular structures:

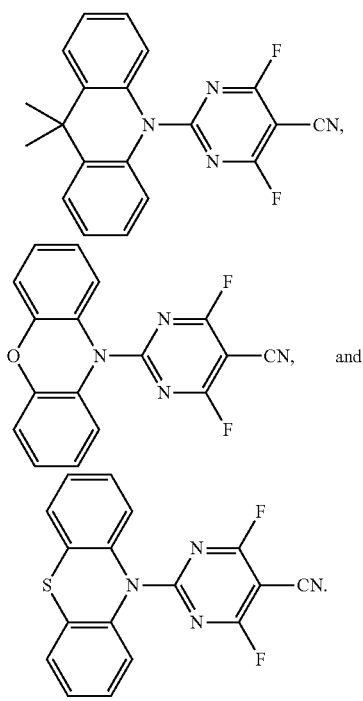

and

The invention also provides a method for synthesizing a green light thermal activated delayed fluorescent material, including the following steps: a reaction solution preparation step including placing an electron donor, an electron acceptor, and a catalyst in a reaction vessel to obtain a reaction solution; a target compound synthesis step including performing a reaction sufficiently at a temperature from 100° C. to 200° C. to obtain a mixed solution including a target compound formed by the reaction; an extraction step including cooling the mixed solution to room temperature and extracting the target compound in the mixed solution; and a target compound purification step including separating and purifying the target compound to obtain the green light thermal activated delayed fluorescent material.

Further, in the reaction solution preparation step, the electron acceptor has a molecular structure of:

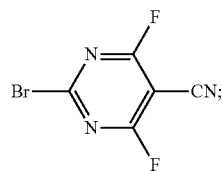 [SMILES: N#Cc1c(F)nc(Br)nc1F]

the electron donor includes at least one of 9,10-dihydro-9, 9-dimethylacridine, phenoxazine, and phenothiazine; and the catalyst includes Further, in the reaction solution preparation step, a molar ratio of the electron acceptor to the electron donor is 1:1-1:3.

Further, in the reaction solution preparation step, the palladium acetate and the tri-tert-butylphosphine tetrafluoroborate are placed together with the electron acceptor and the electron donor in the reaction vessel, and then the reaction vessel is placed in an argon atmosphere, followed by introducing the sodium tert-butoxide and dehydrated, deoxygenated toluene to the reaction vessel, to obtain the reaction solution.

Further, the extraction step includes: pouring the reaction solution into an ice-water mixture with an addition of dichloromethane for multiple extractions, and after the multiple extractions, organic extracts are combined to obtain the target compound; wherein the target compound purification step includes: using a developing solvent to initially purify the target compound by a silica gel column chromatography method, to obtain the green light thermal activated delayed fluorescent material, and wherein the developing solvent in the silica gel column chromatography method is dichloromethane and n-hexane with a volume ratio of 2:1

The present invention also provides an electroluminescent device, including: a substrate layer; a hole transporting and injecting layer disposed on a surface at a side of the substrate layer; a light emitting layer disposed on a surface at a side of the hole transporting and injecting layer away from the substrate layer; an electron transporting layer disposed on a surface at a side of the light emitting layer away from the hole transport and injection layer; and a cathode layer disposed on a surface at a side of the electron transporting layer away from the light emitting layer; wherein, a material used for the light emitting layer is a green light thermal activated delayed fluorescent material.

The technical effect of the present invention is that through molecular design, the green light thermally activated delayed fluorescent material of the present invention reduces minimum energy state difference (ΔEST) between singlet energy state and triplet energy state of the target molecule, so that the target molecule has a fast reverse intersystem crossing constant ranging from $1*10^4$/s to $1*10^7$/s). Meanwhile, the increased number of fluorine atoms on the electron acceptor effectively increases the luminous efficiency of the material.

In the method for synthesizing a green light thermal activated delayed fluorescent material according to the present invention, a series of green light thermally activated delayed fluorescent materials with remarkable thermally activated delayed fluorescence characteristics are obtained through combinations of different functional groups with a great synthesis efficiency. In the synthesized product, the thermally activated delayed fluorescent material has a high proportion in the entire synthesized product, and its photoluminescence quantum yield is high. Therefore, the organic electroluminescent device is improved, and the organic electroluminescent device having the green light thermally activated delayed fluorescent material has high luminous efficiency and brightness.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

Figure 1:
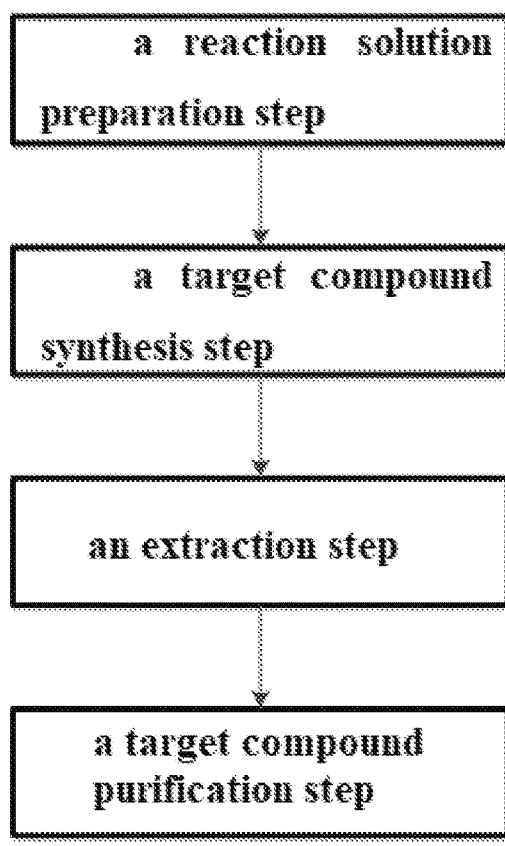
FIG. 1 is a flow chart showing a method for synthesizing a green light thermally activated delayed fluorescent material according to an embodiment of the present invention.

The reference numerals in the figures denote the components as follows:
1. substrate layer;
2. hole transporting and injecting layer;
3. light-emitting layer;
4. electron transporting layer;
5. cathode layer;
101. first curve; 102. second curve; and 103. third curve.

DESCRIPTION OF SPECIFIC EMBODIMENTS OF THE INVENTION

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references.

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention In the drawings, the sizes and relative sizes of layers and regions may be exaggerated for clarity. It will be understood that when an element or layer is referred to as being "on," or "coupled to" another element or layer, it may be directly on, or coupled to the other element or layer, or intervening elements or layers may be present.

Example 1

The present embodiment provides a green light thermal activation delayed fluorescent material, which is a target compound having a molecular structure of D-A and synthesized by a reaction of an electron donor and an electron acceptor, wherein D is the electron donor and A is the electron acceptor, the electron acceptor having a fluorine atom or a fluorine-containing group, the electron acceptor being a planar electron acceptor in an ultra-low triplet energy state, and a triplet energy state of the target compound ranging from 2.0 to 3.0 eV. In this embodiment, the electron acceptor has a molecular structure of:

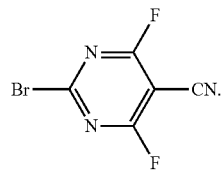 [SMILES: N#Cc1c(F)nc(Br)nc1F]

The electron donor is 9,10-dihydro-9,9-dimethyl acridine, and the electron acceptor and the 9,10-dihydro-9,9-dimethyl acridine are subjected to a series of a chemical reaction to synthesize a first target compound, and the molecular structure of the first target compound is as follows:

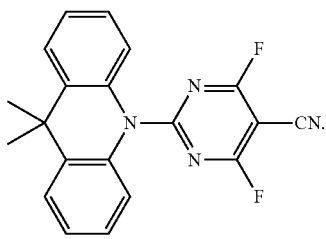 [SMILES: CC1(C)c2ccccc2N(c2nc(F)c(C#N)c(F)n2)c2ccccc21]

The lowest single triplet energy state difference is reduced, so that the target molecule has a fast reverse intersystem crossing constant (ranging from $1*10^4/s - 1*10^7/s$), and a high photoluminescence quantum yield. The synthesized the first target compound has a high thermally activated delayed fluorescence (TADF) ratio and photoluminescence quantum yield (PLQY).

As shown in FIG. 1, in order to explain the green light thermally activated delayed fluorescent material of the present invention in more detail, the embodiment further provides a method for synthesizing the green light thermally activated delayed fluorescent material, which has a reaction scheme generally represented by Formula (1).

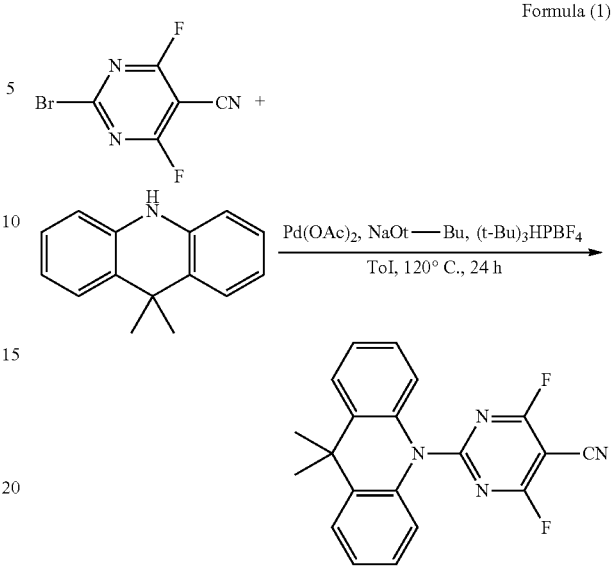

In Formula (1), a molar ratio of the electron acceptor to the electron donor is 1:1-1:3.

The synthesis method of this embodiment will be explained in detail below with reference to Formula (1), which includes the following steps:

A reaction solution preparation step: the electron acceptor (1.09 g, 5 mmol), the electron donor 9,10-dihydro-9,9-dimethyl acridine (1.14 g, 6 mmol), a catalyst, palladium acetate (45 mg, 0.2 mmol), and tri-tert-butylphosphine tetrafluoroborate (0.17 g, 0.6 mmol) are placed in a 100 mL two-neck flask, and sodium tert-butoxide NaOt-Bu (0.58 g, 6 mmol) is added to the two-neck flask in a glove box to obtain a reaction solution. Because sodium t-butoxide (NaOt-Bu) is a hazardous chemical that reacts violently with water to release hydrogen gas, it was stored in the glove box under an argon atmosphere, and it was also taken out under the argon atmosphere.

A target compound synthesis step: providing reaction conditions of the reaction solution, adding 30-50 mL of dehydronated deoxygenated toluene to the two-neck flask in the glove box, and sufficiently reacting at a temperature of 100° C. to 200° C. to obtain a mixed solution. The mixed solution has a first target compound formed by the reaction.

An extraction step: cooling the mixed solution to room temperature, and pouring the mixed solution into an ice-water mixture of 100 mL to 300 mL to extract the first target compound in the mixed solution multiple times with dichloromethane.

A target compound purification step: combining an organic phase, and purifying the first target compound using a developing solvent by silica gel column chromatography to obtain a purified product. In the silica gel column chromatography method, the developing solvent was dichloromethane and n-hexane with a volume ratio of 2:1 to isolate and purify the first target compound, such that green powder of 1.3 g was obtained in a yield of 75%.

The first target compound was subjected to a parameter analysis by detecting instruments to provide the analysis results including a nuclear magnetic resonance (NMR) hydrogen spectrum, an NMR carbon spectrum, and mass spectrometry, wherein the results of NMR hydrogen and carbon spectra were: 1H NMR (300 MHz, CD2C12, δ): 7.19-7.14 (m, 6H), 7.00-6.95 (m, 2H), 1.69 (s, 6H).

The results of the mass spectrometry: MS (EI) m/z: [M]+ calcd (theoretical) for C20H14F2N4,348.12; found (experimental) 348.09.

The results of an elemental analysis: Anal. Calcd (theoretical) for C20H14F2N4: C, 68.96, H, 4.05, N, 16.08; found: C, 78.77, H, 4.01, N, 16.02.

In this embodiment, a green light thermally activated delayed fluorescent material having significant thermal activation delayed fluorescence characteristics was synthesized by combinations of different functional groups with a relatively high synthesis rate. In the synthesized product, the thermally activated delayed fluorescent material had a high proportion in the entire synthesized product, and had a high photoluminescence quantum yield.

The characteristic parameters of the first target compound were analyzed, and the analysis results are shown in Table 1.

Table 1 is the measured parameters, such as a lowest singlet state (S1) and a lowest triplet energy state (T1) of the first target compound:

TABLE 1

| compound | PL Peak (nm) | S1 (eV) | T1 (eV) | ΔEST (eV) | HOMO (eV) | LUMO (eV) |
| --- | --- | --- | --- | --- | --- | --- |
| First compound | 513 | 2.42 | 2.33 | 0.09 | −5.52 | −2.43 |

Figure 2:
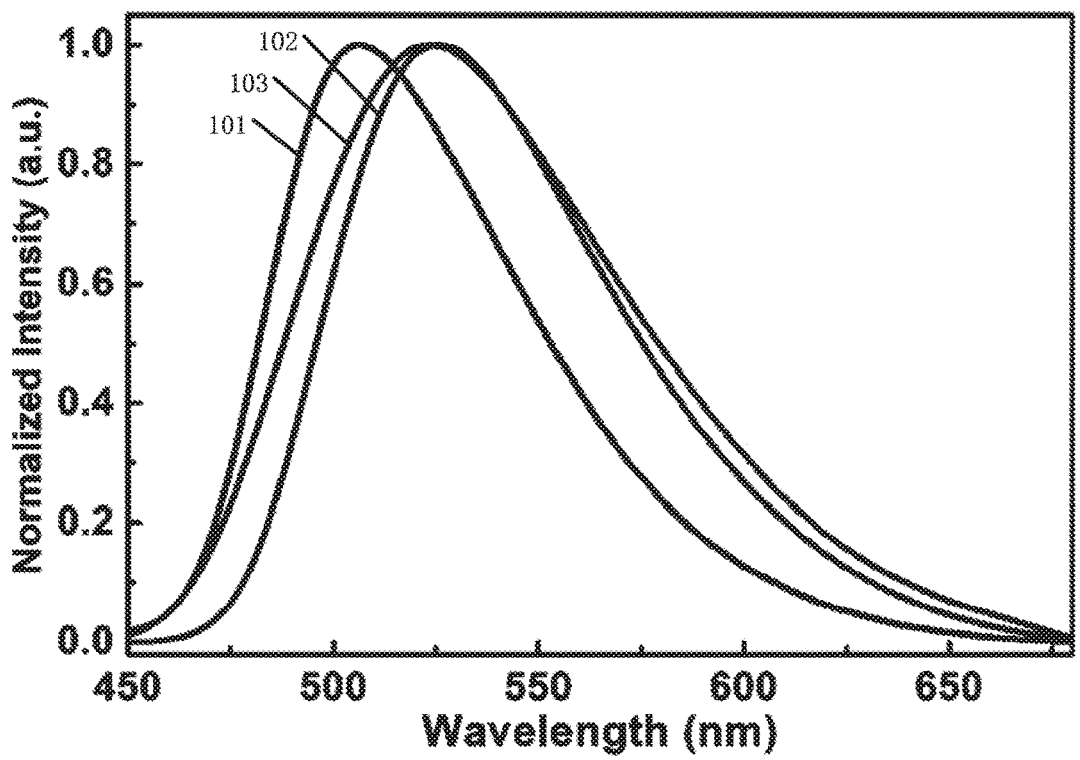
FIG. 2 is a photoluminescence spectrum of a compound synthesized in an embodiment of the present invention in a toluene solution at room temperature.

As shown in FIG. 2, a first curve 101 is a photoluminescence spectrum of the first target compound in a toluene solution at room temperature.

Figure 3:
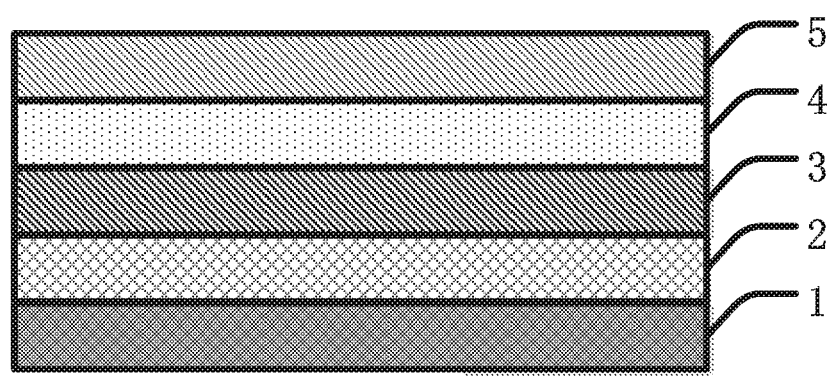
FIG. 3 is a schematic structural diagram of an electroluminescent device according to an embodiment of the invention.

As shown in FIG. 3, another embodiment of the present invention further provides an electroluminescent device, including: a substrate layer 1; a hole transporting and injecting layer 2 disposed on an upper surface of the substrate layer 1; and a light emitting layer 3 disposed on an upper surface of the hole transporting and injecting layer 2; an electron transporting layer 4 disposed on an upper surface of the light emitting layer 3; and a cathode layer 5 disposed on an upper surface of the electron transporting layer 4; wherein the light emitting layer 3 was the green light thermally activated delayed fluorescent material, i.e., the first target compound.

A poly 3,4-ethylenedioxythiophene:polystyrene sulfonate (PEDOT:PSS) with a thickness of 50 nm was spin-coated on the cleaned substrate layer 1 to obtain the hole transporting and injecting layer 2. Material of the substrate layer 1 was glass and conductive glass (ITO). The green light thermally activated delayed fluorescent material with a thickness of 40 nm was spin-coated on the hole transport and injection layer 2 to obtain the light-emitting layer 3. Under high vacuum, a layer of 1,3,5-tris(3-(3-pyridyl)phenyl)benzene (Tm3PyPB) with a thickness of 40 nm was evaporated on the light-emitting layer 3 to obtain the electron transporting layer 4. Then, under high vacuum, a layer of lithium fluoride with a thickness of 1 nm and a layer of aluminum with a thickness of 100 nm were evaporated on the electron transporting layer 4 to obtain the cathode layer 5, thus completing a first electroluminescent device.

Current-brightness-voltage characteristics of the device were obtained by a Keithley source measurement system (Keithley 2400 Sourcemeter, Keithley 2000 Currentmeter) with a calibrated silicon photodiode. The electroluminescence spectrum was measured by a French JY SPEX CCD3000 spectrometer. All measurements were conducted at room temperature under ambient atmosphere.

The performance data of the first electroluminescent device is shown in Table 2 as below.

Table 2 shows the measured maximum current efficiency, maximum external quantum efficiency, and other parameters of the first electroluminescent device.

TABLE 2

| Device | maximum current efficiency (cd/A) | CIEx | maximum external quantum efficiency (%) |
| --- | --- | --- | --- |
| First electroluminescent device | 87.6 | 0.22 | 25.7 |

The electroluminescent device fabricated by using the green light thermally activated delayed fluorescent material has high luminous efficiency and brightness, and high production efficiency and long service life can be achieved.

When a molar ratio of the electron acceptor to the electron donor was 1:1 to 1:1.5, the synthesized molecular structure had a molecular structure of D-A.

The thermally activated delayed fluorescence material of the D-A molecular structure had a high proportion in the entire synthesized product, and its photoluminescence quantum yield was high, so that the target molecule had a fast reverse intersystem crossing constant (ranging from 1*104/s–1*107/s) and a high photoluminescence quantum yield.

Example 2

The present embodiment provides a green light thermally activated delayed fluorescent material, which was a target compound synthesized by an electron donor and an electron acceptor, having a molecular structure of D-A and synthesized by a reaction of the electron donor and the electron acceptor, wherein D is the electron donor and A is the electron acceptor, the electron acceptor having a fluorine atom or a fluorine-containing group, the electron acceptor being a planar electron acceptor in an ultra-low triplet energy level, and a triplet energy level of the target compound ranging from 2.0 to 3.0 eV. In this embodiment, the molecular structure of the electron acceptor is

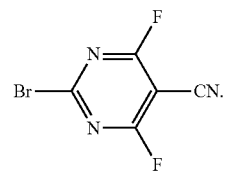 [SMILES: N#Cc1c(F)nc(Br)nc1F]

The electron donor is phenoxazine, having a molecular formula of C12H9NO, and the electron acceptors and the phenoxazine are subjected to a series of chemical reactions to synthesize a second target compound, having a molecular structure of:

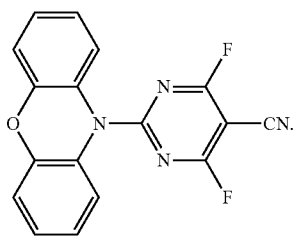 [SMILES: N#Cc1c(F)nc(N2c3ccccc3Oc3ccccc32)nc1F]

The lowest single triplet energy state difference is reduced, so that the target molecule has a fast reverse intersystem crossing constant (ranging from $1*10^4$/s to $1*10^7$/s), and high photoluminescence quantum yield. The synthesized second target compound has a high TADF ratio and PLQY.

As shown in FIG. 1, the embodiment further provides a method for synthesizing a green light thermally activated delayed fluorescent material, which has a reaction scheme generally represented by Formula (2).

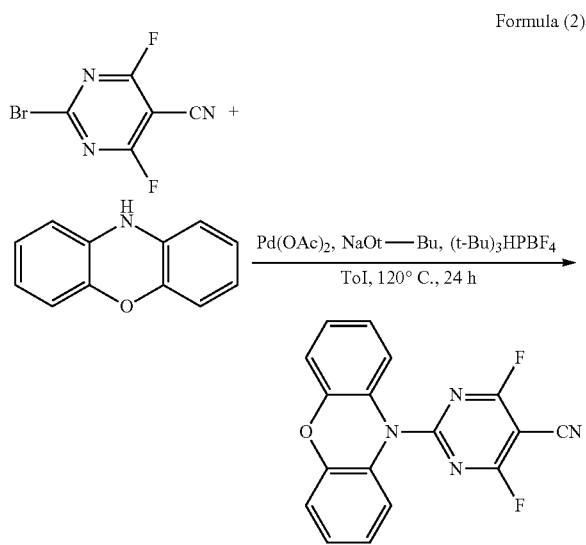

Formula (2)

In Formula (2), a molar ratio of the electron acceptor to the electron donor is 1:1-1:3.

The synthesis method of this embodiment will be explained in detail below with reference to Formula (2), which includes the following steps:

A reaction solution preparation step: the electron acceptor (1.09 g, 5 mmol); the electron donor, phenoxazine (1.10 g, 6 mmol) and a catalyst, palladium acetate (45 mg, 0.2 mmol), and tri-tert-butylphosphine IV Fluoroborate (0.17 g, 0.6 mmol) was placed in a 100 mL two-neck flask, and sodium tert-butoxide NaOt-Bu (0.58 g, 6 mmol) was added to the two-neck flask in a glove box to obtain a reaction solution. Because sodium t-butoxide (NaOt-Bu) is a hazardous chemical that reacts violently with water to release hydrogen gas, it was stored in the glove box under an argon atmosphere, and it was also taken out under the argon atmosphere.

A target compound synthesis step: providing reaction conditions of the reaction solution, adding 30-50 mL of dehydronated deoxygenated toluene to the two-neck flask in the glove box, and sufficiently reacting at a temperature of 100° C. to 200° C. to obtain a mixed solution. The mixed solution has a second target compound formed by the reaction.

An extraction step: cooling the mixed solution to room temperature, and pouring the mixed solution into 100 mL to 300 mL of an ice-water mixture to extract the second target compound in the mixed solution multiple times with dichloromethane.

A target compound purification step: combining an organic phase, and purifying the second target compound using a developing solvent by silica gel column chromatography to obtain a purified product. In the silica gel column chromatography method, the developing solvent was dichloromethane and n-hexane with a volume ratio of 2:1 to isolate and purify the second target compound, such that green powder of 1.2 g was obtained in a yield of 75%.

The second target compound was subjected to a parameter analysis by detecting instruments to provide the analysis results including a nuclear magnetic resonance (NMR) hydrogen spectrum, an NMR carbon spectrum, and a mass spectrometry, wherein the results of NMR hydrogen and carbon spectra were: 1H NMR (300 MHz, CD2Cl2, δ): 7.14 (d, J=7.2 Hz, 2H), 7.01-6.96 (m, 6H).

The results of the elemental analysis: Anal. Calcd (theoretical) for C17H8F2N4O: C, 63.36, H, 2.50, N, 17.39; found: C, 63.23H, 2.45, N, 17.22.

In this embodiment, a green light thermally activated delayed fluorescent material having significant thermal activation delayed fluorescence characteristics was synthesized by combinations of different functional groups with a relatively high synthesis rate. In the synthesized product, the thermally activated delayed fluorescent material had a high proportion in the entire synthesized product and had a high photoluminescence quantum yield.

The characteristic parameters of the second target compound were analyzed and the analysis results are shown in Table 3.

Table 3 is the measured parameters, such as a lowest singlet state (S1) and a lowest triplet energy state (T1) of the second target compound:

TABLE 3

| Compound | PL Peak (nm) | S1 (eV) | T1 (eV) | ΔEST (eV) | HOMO (eV) | LUMO (eV) |
|---|---|---|---|---|---|---|
| Second compound | 526 | 2.36 | 2.29 | 0.07 | −5.63 | −2.44 |

As shown in FIG. 2, a second curve 102 is a photoluminescence spectrum of the second target compound in a toluene solution at room temperature.

As shown in FIG. 3, another embodiment of the present invention further provides an electroluminescent device, including: a substrate layer 1; a hole transporting and injecting layer 2 disposed on an upper surface of the substrate layer 1; and a light emitting layer 3 disposed on an upper surface of the hole transporting and injecting layer 2; an electron transporting layer 4 disposed on an upper surface of the light emitting layer 3; and a cathode layer 5 disposed on an upper surface of the electron transporting layer 4; wherein the light emitting layer 3 was the green light thermally activated delayed fluorescent material, i.e., a second target compound.

A poly 3,4-ethylenedioxythiophene:polystyrene sulfonate (PEDOT:PSS) with a thickness of 50 nm was spin-coated on the cleaned substrate layer 1 to obtain the hole transporting and injecting layer 2. Material of the substrate layer 1 was glass and conductive glass (ITO). The green light thermally activated delayed fluorescent material with a thickness of 40 nm was spin-coated on the hole transport and injection layer 2 to obtain a light-emitting layer 3. Under high vacuum, a layer of 1,3,5-tris(3-(3-pyridyl)phenyl)benzene (Tm3PyPB) with a thickness of 40 nm was evaporated on the light-emitting layer 3 to obtain the electron transporting layer 4. Then, under high vacuum, a layer of lithium fluoride with a thickness of 1 nm and a layer of aluminum with a thickness of 100 nm were evaporated on the electron transporting layer 4 to obtain the cathode layer 5, thus completing a second electroluminescent device.

Current-brightness-voltage characteristics of the device were obtained by a Keithley source measurement system (Keithley 2400 Sourcemeter, Keithley 2000 Currentmeter) with a calibrated silicon photodiode. The electroluminescence spectrum was measured by a French JY SPEX CCD3000 spectrometer. All measurements were conducted at room temperature under ambient atmosphere.

The performance data of the second electroluminescent device is shown in Table 4 as below.

Table 4 shows the measured maximum current efficiency, maximum external quantum efficiency, and other parameters of the second electroluminescent device:

TABLE 4

| Device | maximum current efficiency (cd/A) | CIEx | maximum external quantum efficiency (%) |
|---|---|---|---|
| Second electroluminescent device | 94.5 | 0.23 | 27.6 |

The electroluminescent device fabricated by using the green light thermally activated delayed fluorescent material has high luminous efficiency and brightness, and high production efficiency and long service life can be achieved.

When a molar ratio of the electron acceptor to the electron donor was 1:1 to 1:1.5, the synthesized molecular structure had a molecular structure of D-A.

The thermally activated delayed fluorescent material of the D-A molecular structure had a high proportion in the entire synthesized product, and its photoluminescence quantum yield was high, so that the target molecule had a fast reverse intersystem crossing constant (ranging from $1*10^4/\text{s}-1*10^7/\text{s}$) and a high photoluminescence quantum yield.

Example 3

The present embodiment provides a green light thermally activated delayed fluorescent material, which was a target compound synthesized by an electron donor and an electron acceptor, having a molecular structure of D-A and synthesized by a reaction of an electron donor and an electron acceptor, wherein D is the electron donor and A is the electron acceptor, the electron acceptor having a fluorine atom or a fluorine-containing group, the electron acceptor being a planar electron acceptor in an ultra-low triplet energy level, and a triplet energy level of the target compound ranging from 2.0 to 3.0 eV. In this embodiment, the electron acceptor has a molecular structure of:

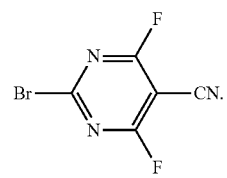

The electron donor is phenoxazine, having a the molecular formula of C12H9NS, and the electron acceptors and the phenoxazine are subjected to a series of chemical reactions to synthesize a third target compound, having a molecular structure of:

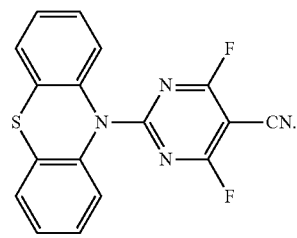 [SMILES: N#Cc1c(F)nc(N2c3ccccc3Sc3ccccc32)nc1F]

The lowest single triplet energy state difference is reduced, so that the target molecule has a fast reverse intersystem crossing constant (ranging from $1*10^4/\text{s}-1*10^7/\text{s}$), and high photoluminescence quantum yield. The synthesized third target compound have a high TADF ratio and PLQY.

As shown in FIG. 1, the embodiment further provides a method for synthesizing a green light thermally activated delayed fluorescent material, which has a reaction scheme generally represented by Formula (3).

Formula (3)

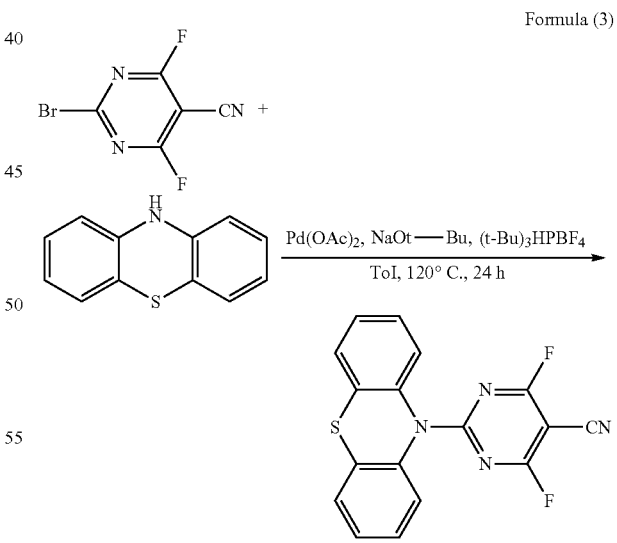

In Formula (3), a molar ratio of the electron acceptor to the electron donor is 1:1-1:3.

The synthesis method of this embodiment will be explained in detail below with reference to Formula (3), which includes the following steps:

A reaction solution preparation step: the electron acceptor (1.09 g, 5 mmol); the electron donor, phenothiazine (1.09 g, 5 mmol) and a catalyst, palladium acetate (45 mg, 0.2 mmol) and tri-tert-butylphosphine IV Fluoroborate (0.17 g, 0.6 mmol) was placed in a 100 mL two-neck flask, and sodium tert-butoxide NaOt-Bu (0.58 g, 6 mmol) was added to the two-neck flask in a glove box to obtain a reaction solution. Because sodium t-butoxide (NaOt-Bu) is a hazardous chemical that reacts violently with water to release hydrogen gas, it was stored in the glove box under an argon atmosphere, and it was also taken out under the argon atmosphere.

A target compound synthesis step: providing reaction conditions of the reaction solution, adding 30-50 mL of dehydronated deoxygenated toluene to the two-neck flask in the glove box, and sufficiently reacting at a temperature of 100° C. to 200° C. to obtain a mixed solution. The mixed solution has a third target compound formed by the reaction.

An extraction step: cooling the mixed solution to room temperature, and pouring the mixed solution into 100 mL to 300 mL of an ice-water mixture to extract the third target compound in the mixed solution multiple times with dichloromethane.

A target compound purification step: combining an organic phase, and purifying the third target compound using a developing solvent by silica gel column chromatography to obtain a purified product. In the silica gel column chromatography method, the developing solvent was dichloromethane and n-hexane with a volume ratio of 2:1 to isolate and purify the third target compound, such that green powder of 1.1 g was obtained in a yield of 65%.

The third target compound was subjected to parameter analysis by detecting instruments to provide analysis results including a nuclear magnetic resonance (NMR) hydrogen spectrum, an NMR carbon spectrum, and mass spectrometry result, wherein the results of NMR hydrogen and carbon spectra were: 1H NMR(300 MHz, CD2C12, δ): 7.121-7.16 (m, 6H), 7.00-6.97 (m, 2H).

The results of mass spectrometry: MS (EI) m/z: [M]+ calcd (theoretical) for C17H8F2N4S, 338.04; found (experimental), 338.02.

The results of the elemental analysis: Anal. Calcd (theoretical value) for C17H8F2N4S: C, 60.35, H, 2.38, N, 16.56; found: C, 60.23, H, 2.33, N, 16.42.

In this embodiment, a green light thermally activated delayed fluorescent material having significant thermal activation delayed fluorescence characteristics was synthesized by combinations of different functional groups with a relatively high synthesis rate. In the synthesized product, the thermally activated delayed fluorescent material had a high proportion in the entire synthesized product and had a high photoluminescence quantum yield.

The characteristic parameters of the third target compound were analyzed and the analysis results are shown in Table 5.

Table 5 is the measured parameters, such as a lowest singlet state (S1) and a lowest triplet energy state (T1) of the third target compound:

TABLE 5

| compound | PL Peak (nm) | S1 (eV) | T1 (eV) | EST (eV) | HOMO (eV) | LUMO (eV) |
|---|---|---|---|---|---|---|
| third compound | 528 | 2.35 | 2.29 | 0.06 | −5.66 | −2.43 |

As shown in FIG. 2, a third curve 103 is a photoluminescence spectrum of the third target compound in a toluene solution at room temperature.

As shown in FIG. 3, another embodiment of the present invention further provides an electroluminescent device, including: a substrate layer 1; a hole transporting and injecting layer 2 disposed on an upper surface of the substrate layer 1; and a light emitting layer 3 disposed on an upper surface of the hole transporting and injecting layer 2; an electron transporting layer 4 disposed on an upper surface of the light emitting layer 3; and a cathode layer 5 disposed on an upper surface of the electron transporting layer 4; wherein the light emitting layer 3 was the green light thermally activated delayed fluorescent material, i.e., the third target compound.

A poly 3,4-ethylenedioxythiophene:polystyrene sulfonate (PEDOT:PSS) with a thickness of 50 nm was spin-coated on the cleaned substrate layer 1 to obtain the hole transporting and injecting layer 2. Material of the substrate layer 1 was glass and conductive glass (ITO). The green light thermally activated delayed fluorescent material with a thickness of 40 nm was spin-coated on the hole transport and injection layer 2 to obtain the light-emitting layer 3. Under high vacuum, a layer of 1,3,5-tris(3-(3-pyridyl)phenyl)benzene (Tm3PyPB) with a thickness of 40 nm was evaporated on the light-emitting layer 3 to obtain the electron transporting layer 4. Then, under high vacuum, a layer of lithium fluoride with a thickness of 1 nm and a layer of aluminum with a thickness of 100 nm were evaporated on the electron transporting layer 4 to obtain the cathode layer 5, thus completing a third electroluminescent device.

Current-brightness-voltage characteristics of the device were obtained by a Keithley source measurement system (Keithley 2400 Sourcemeter, Keithley 2000 Currentmeter) with a calibrated silicon photodiode. The electroluminescence spectrum was measured by a French JY SPEX CCD3000 spectrometer. All measurements were conducted at room temperature under ambient atmosphere.

The performance data of the third electroluminescent device is shown in Table 6 as below.

Table 6 shows the measured maximum current efficiency, maximum external quantum efficiency, and other parameters of the third electroluminescent device:

TABLE 6

| Device | maximum current efficiency (cd/A) | CIEx | maximum external quantum efficiency (%) |
|---|---|---|---|
| Third electroluminescent device | 92.6 | 0.23 | 26.9 |

The electroluminescent device fabricated by using the green light thermally activated delayed fluorescent material has high luminous efficiency and brightness, and high production efficiency and long service life can be achieved.

When a molar ratio of the electron acceptor to the electron donor was 1:1 to 1:1.5, the synthesized molecular structure had a molecular structure of D-A.

The thermally activated delayed fluorescent material of the D-A molecular structure had a high proportion in the entire synthesized product, and its photoluminescence quantum yield was high, so that the target molecule had a fast reverse intersystem crossing constant (ranging from $1*10^4$/s–$1*10^7$/s) and a high photoluminescence quantum yield.

The display module of the present invention is described in detail above. The principles and implementations of the present invention are described in the specific examples. While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A green light thermal activation delayed fluorescent material, which is a target compound having a molecular structure of D-A and synthesized by a reaction of an electron donor and an electron acceptor, wherein D is the electron donor and A is the electron acceptor, the electron acceptor having a fluorine atom or a fluorine-containing group, the electron acceptor being a planar electron acceptor in an ultra-low triplet energy level, and a triplet energy level of the target compound ranging from 2.0 to 3.0 eV, wherein the electron acceptor has a molecular structure of:

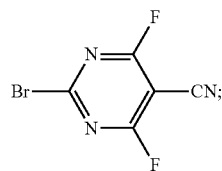 [SMILES: N#Cc1c(F)nc(Br)nc1F]

and the electron donor comprises at least one of 9,10-dihydro-9,9-dimethylacridine, phenoxazine, and phenothiazine.

2. The green light thermal activated delayed fluorescent material according to claim 1, wherein the molecular structure D-A of the green light thermal activated delayed fluorescent material is one of the following molecular structures:

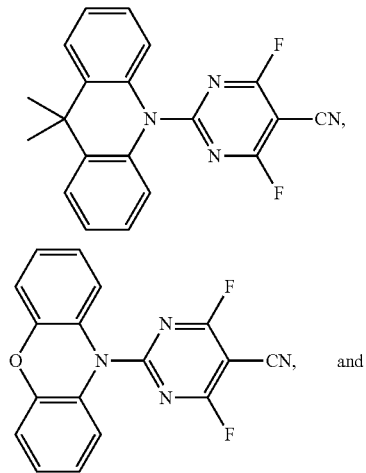

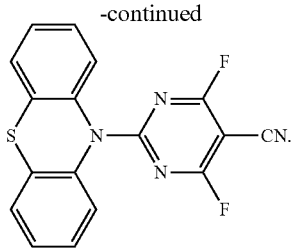

3. A method for synthesizing a green light thermal activated delayed fluorescent material, comprising the following steps:

a reaction solution preparation step comprising placing an electron donor, an electron acceptor, and a catalyst in a reaction vessel to obtain a reaction solution;

a target compound synthesis step comprising performing a reaction sufficiently at a temperature from 100° C. to 200° C. to obtain a mixed solution comprising a target compound formed by the reaction;

an extraction step comprising cooling the mixed solution to room temperature and extracting the target compound in the mixed solution; and a target compound purification step comprising separating and purifying the target compound to obtain the green light thermal activated delayed fluorescent material, wherein the electron acceptor has a molecular structure of:

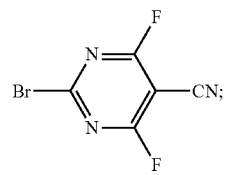

the electron donor comprises at least one of 9,10-dihydro-9,9-dimethylacridine, phenoxazine, and phenothiazine; and the catalyst comprises palladium acetate, tri-tert-butylphosphine tetrafluoroborate, and sodium t-butoxide.

4. The method for synthesizing the green light thermal activated delayed fluorescent material according to claim 3, wherein in the reaction solution preparation step, a molar ratio of the electron acceptor to the electron donor is 1:1-1:3.

5. The method for synthesizing the green light thermal activated delayed fluorescent material according to claim 4, wherein in the reaction solution preparation step, the palladium acetate and the tri-tert-butylphosphine tetrafluoroborate are placed together with the electron acceptor and the electron donor in the reaction vessel, and then the reaction vessel is placed in an argon atmosphere, followed by introducing the sodium tert-butoxide and dehydrated, deoxygenated toluene to the reaction vessel to obtain the reaction solution.

6. The method for synthesizing the green light thermal activated delayed fluorescent material according to claim 3, wherein the extraction step comprises:

pouring the reaction solution into an ice-water mixture with an addition of dichloromethane for multiple extractions, and after the multiple extractions, organic extracts are combined to obtain the target compound;

wherein the target compound purification step comprises:

using a developing solvent to initially purify the target compound by a silica gel column chromatography method to obtain the green light thermal activated delayed fluorescent material.

7. The method for synthesizing the green light thermal activated delayed fluorescent material according to claim 6, wherein the developing solvent in the silica gel column chromatography method is dichloromethane and n-hexane with a volume ratio of 2:1.

8. An electroluminescent device, comprising:
- a substrate layer;
- a hole transporting and injecting layer disposed on a surface at a side of the substrate layer;
- a light emitting layer disposed on a surface at a side of the hole transporting and injecting layer away from the substrate layer;
- an electron transporting layer disposed on a surface at a side of the light emitting layer away from the hole transport and injection layer; and
- a cathode layer disposed on a surface at a side of the electron transporting layer away from the light emitting layer;
- wherein, material used for the light emitting layer is the green light thermal activated delayed fluorescent material according to claim 1.

* * * * *